United States Patent
Kobayashi et al.

(10) Patent No.: US 6,437,769 B1
(45) Date of Patent: Aug. 20, 2002

(54) DISPLAY APPARATUS

(75) Inventors: Hidekazu Kobayashi, Nagano-ken; Mutsumi Kimura, Suwa, both of (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/509,199

(22) PCT Filed: Jul. 23, 1999

(86) PCT No.: PCT/JP99/03980

§ 371 (c)(1), (2), (4) Date: Mar. 23, 2000

(87) PCT Pub. No.: WO00/05703

PCT Pub. Date: Feb. 3, 2000

(30) Foreign Application Priority Data

Jul. 24, 1998 (JP) .......................................... 10-210011

(51) Int. Cl.7 ................................................. G09G 3/36
(52) U.S. Cl. ........................................... 345/102; 48/84
(58) Field of Search ............................ 345/76, 77, 44, 345/45, 48, 102, 84; 353/31, 38

(56) References Cited

U.S. PATENT DOCUMENTS

| | | | | |
|---|---|---|---|---|
| 5,248,917 A | * | 9/1993 | Hamagishi et al. | 315/169.1 |
| 5,337,068 A | * | 8/1994 | Stewart et al. | 345/88 |
| 5,808,410 A | * | 9/1998 | Pinker et al. | 313/493 |
| 5,969,832 A | * | 10/1999 | Nakanishi et al. | 359/15 |
| 6,111,560 A | * | 8/2000 | May | 345/102 |

FOREIGN PATENT DOCUMENTS

| | | |
|---|---|---|
| JP | A-1-179914 | 7/1989 |
| JP | A-2-165592 | 6/1990 |
| JP | 3-187192 | 8/1991 |
| JP | A-3-269995 | 12/1991 |
| JP | A-5-19257 | 1/1993 |
| JP | A-5-264988 | 10/1993 |
| JP | A-5-346570 | 12/1993 |
| JP | A-6-67149 | 3/1994 |
| JP | A-6-301004 | 10/1994 |
| JP | A-6-301032 | 10/1994 |
| JP | A-7-84531 | 3/1995 |
| JP | A-8-83688 | 3/1996 |
| JP | A-8-153582 | 6/1996 |
| JP | WO-A1-97/07654 | 2/1997 |
| JP | A-9-101497 | 4/1997 |
| JP | A-9-114421 | 5/1997 |
| JP | A-9-127885 | 5/1997 |
| JP | A-9-139286 | 5/1997 |
| JP | A-10-12379 | 1/1998 |
| JP | A-10-39791 | 2/1998 |
| JP | A-10-153967 | 6/1998 |
| JP | A-10-187058 | 7/1998 |
| JP | A-10-189244 | 7/1998 |

* cited by examiner

*Primary Examiner*—Chanh Nguyen
*Assistant Examiner*—Fritz Alphonse
(74) *Attorney, Agent, or Firm*—Oliff & Berridge, PLC

(57) ABSTRACT

A display apparatus having a structure in which planar multicolor light sources (201, 202, 203, and 204), such as ELs, are used as multicolor light sources, and a planar optical modulation panel (210) is combined therewith. In contrast with a construction in which a multicolor cold-cathode tube and a light valve are driven by time division, the outer shape of the display apparatus can be reduced, power consumption is reduced, and excellent color display can be performed.

32 Claims, 16 Drawing Sheets

DISPLAY APPARATUS

BACKGROUND OF THE INVENTION

1. Field of the Invention

The present invention relates to a display apparatus used in a display of a terminal of an information apparatus, such as a computer, a television set, or a mobile phone, and to a construction of a backlight used therefor.

2. Description of Related Art

For example, in color display apparatuses that have hitherto used liquid crystal, one pixel is divided into color pixels corresponding to each of the colors red, blue, and green in a manner similar to a color CRT, color filters corresponding to each color pixel are simultaneously formed and illuminated from the back by a white backlight, and each of the colors are simultaneously displayed so as to display the color of one pixel. According to this method, however, since one pixel is divided into three, the aperture ratio of the pixel decreases thereby giving a dark display, a number of signal drivers for driving liquid crystal panels corresponding to the number of colors are required, and color filters as fine as the color pixels are required, resulting in an increase in cost.

Thus, as disclosed in Japanese Unexamined Patent Publication No. 5-19257, a color display apparatus is proposed in which a multicolor backlight is combined with light valves. According to this construction, one pixel is not divided into each of the colors red, green, and blue. Therefore, when, for example, an active matrix panel is used, since the number of active elements to be formed on the whole of the panel is reduced to one-third, the yield is increased, the aperture ratio of one pixel increases to give a bright display, the number of signal drivers is reduced to one-third of that in a conventional display apparatus, and the cost can be reduced because the color filters are not required.

In a construction using cold-cathode tubes, Japanese Unexamined Patent Publication No. 5-19257 discloses an arrangement in which red R, green G, and blue B cold-cathode tubes and light guide plates to be paired therewith are stacked, and discloses a driving method. Japanese Unexamined Patent Publication Nos. 5-264988 and 5-346570 disclose a construction in which three R, G, and B cold-cathode tubes are arranged on one end surface of a sheet of a light guide plate, and a construction in which light from one white illuminant is converted into R, G, and B time-divided light by R, G, and B filter shutters. Japanese Unexamined Patent Publication No. 6-67149 discloses a construction in which three R, G, and B cold-cathode tubes are arranged on the back of a panel, and a driving method therefor. In particular, voltages supplied to the backlights of each color are independently controlled so that the colors are balanced. As an R, G, and B switching backlight, Japanese Unexamined Patent Publication No. 6-301004 discloses a combination of a white light source, R, G, and B color filters, a liquid crystal shutter, and a diffusing plate. Japanese Unexamined Patent Publication No. 6-301032 discloses a combination of R, G, and B light sources and a liquid crystal shutter. Japanese Unexamined Patent Publication No. 9-101497 discloses a driving method for a gray-level display using TN-mode liquid crystal light valves and the above construction. In Japanese Unexamined Patent Publication No. 9-114421, in a construction using a TFT element, clear display is obtained by resetting the state of a liquid crystal when an image signal is to be rewritten.

On the other hand, Japanese Unexamined Patent Publication No. 3-187192 discloses the use of an organic EL, which is thin, ad has low power consumption, as a backlight source of a conventional direct-view-type color display apparatus.

According to the above-described conventional techniques, when a light source, such as a cold-cathode tube, is used as a multicolor backlight, the outer shape of the display apparatus is large, the cost is high because of a complicated driving circuit, and the backlight consumes much power and cannot be used in a portable information apparatus.

In Japanese Unexamined Patent Publication No. 3-187192 using the organic EL for the backlight, since R, G, and B EL devices are simply arranged instead of color filters of a conventional color liquid crystal panel, as many pixels as in the conventional display apparatus are required, and the number of drivers is about equal to that in the conventional display apparatus. Therefore, the cost is high and the aperture ratio is low.

SUMMARY OF THE INVENTION

The present invention has been achieved in consideration of the above problems, and an object is to provide a multicolor light source having a simple structure and a simplified driving circuit, and to provide a display apparatus using the light source which is compact, has low power consumption, and is inexpensive.

According to the present invention, there is provided a display apparatus that may include a planar optical modulation panel; and a surface light source arranged on the back of the planar optical modulation panel, and having at least a first luminescent region including a luminescent material emitting light with a first color and a second luminescent region including a luminescent material emitting light with a second color different from the first color in a surface substantially parallel to a surface of the planar optical modulation panel;

wherein one scanning period of a color image to be displayed is divided into the number of luminescent colors of the surface light source, each of the luminescent regions is allowed to emit light in accordance with each of the divided periods, brightness information of the luminescent color of the emitted light is formed by the planar optical modulation panel in synchronism with the periods, and light of each color is optically modulated to perform color display.

Furthermore, according to the present invention, there is provided a display apparatus that may include a planar optical modulation panel; and a surface light source arranged on the back of the planar optical modulation panel, and having at least a first luminescent region including a luminescent material emitting light with a first color and a second luminescent region including a luminescent material emitting light with a second color different from the first color in a surface substantially parallel to a surface of the planar optical modulation panel, and the first luminescent region and the second luminescent region have a spiral form.

DESCRIPTION OF THE PREFERRED EMBODIMENTS

Figure 1:
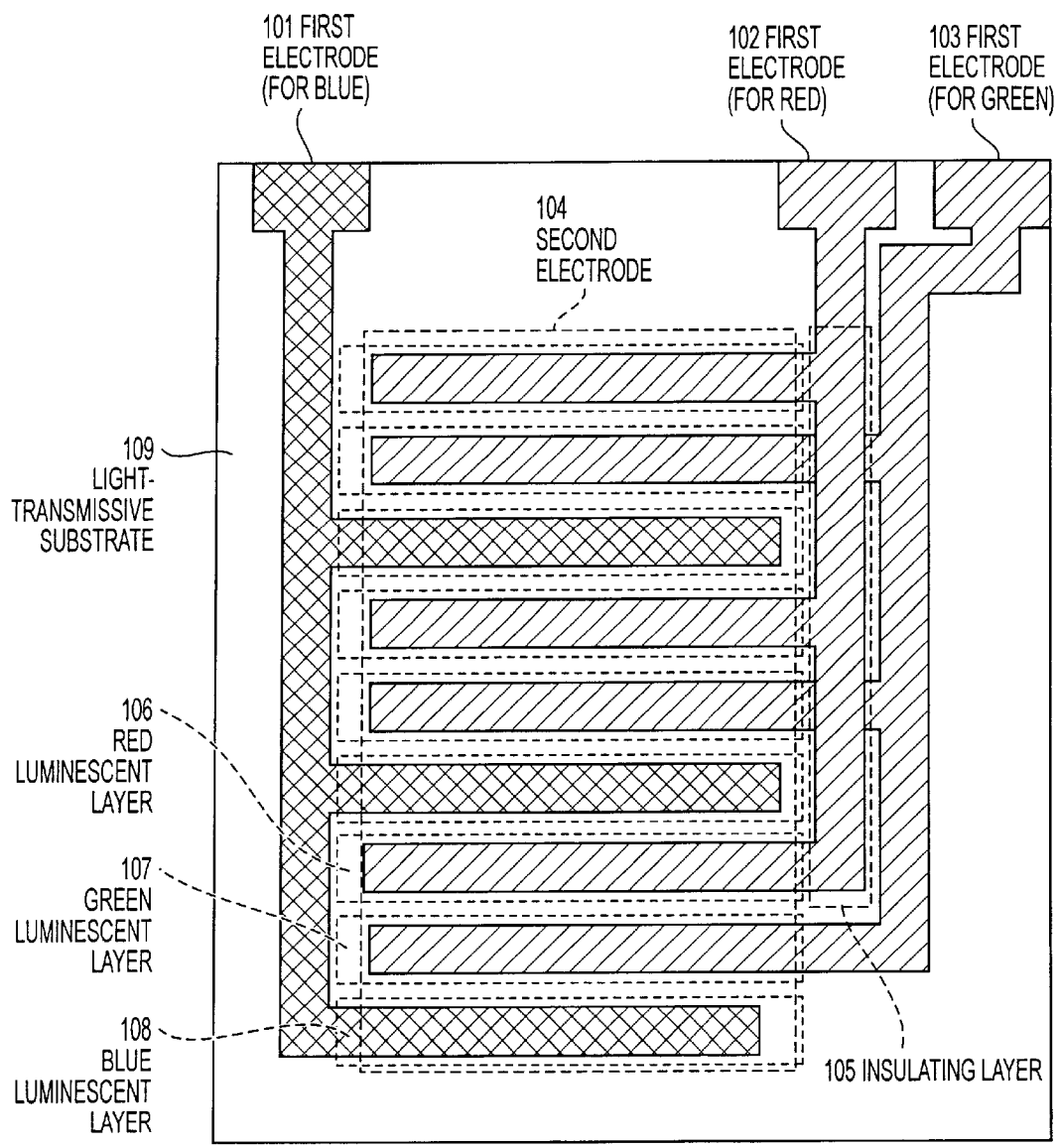
FIG. 1 is a plan view showing a light source portion of a display apparatus of Example 1.

In a display apparatus of the present invention having a structure in which a surface light source capable of emitting light with multiple colors is superimposed on a planar optical modulation panel, and scanning the optical modulation panel to form a color image, one scanning period of the color image is divided into the same number as the number of luminescent colors of the light source, the light source is illuminated with a color corresponding to each of the divided periods (color display periods), and brightness information of the color is, in synchronism therewith, displayed by the planar optical modulation panel to thereby perform color display. The display apparatus may be provided such that the surface light source is arranged on the back of the planar optical modulation panel, and has at least a first luminescent region including a luminescent material emitting light with a first color, that is, a luminescent material using a wavelength region of the first color as a luminescent wavelength, and a second luminescent region including a luminescent material emitting light with a second color different from the first color, that is, a luminescent material using a wavelength region of the first color as a luminescent wavelength to emit multicolor light, and one scanning period of the color image to be displayed is divided into the number of luminescent colors of the surface light source, more specifically, the number of types of the luminescent regions, to perform image display.

In the display apparatus of the present invention, as a preferred mode, the surface light source has at least the first luminescent region emitting light with the wavelength region of the first color and the second luminescent region emitting light with the wavelength region of the second color different from the first color with the structure in which a plurality of types of luminescent materials having different luminescent colors are arranged as a periodic alignment of a specific pattern within one plane on a substrate having formed thereon a first electrode which is transparent and which may be patterned, and a second electrode which may be patterned is formed on a luminescent layer including each of luminescent materials, and further includes a device for applying a voltage sufficient to emit light between the selected first and second electrodes in a selected period.

In the display apparatus having the structure as described above, the surface light source has a thin thickness, more preferably, a thickness nearly similar to the thickness of the substrate, and an arbitrary luminescent color can be obtained with a desired timing. In the display apparatus, when all of the luminescent regions constituting the light source are illuminated (emitted light), each of the colors is uniformly mixed to emit white light, and no color phase irregularity is produced. In addition, power consumption can be reduced as compared with a cold-cathode tube generally used in a liquid crystal display apparatus.

Furthermore, in the surface light source, in addition to the first and second luminescent regions, a third luminescent region using a luminescent material of a luminescent color different from that of these luminescent regions is provided, for example, three colors of red, green, and blue luminescent regions are provided. When these colors are displayed by time division, the optical modulation panel may form image information corresponding to the luminescent color of the surface light source, and since the number of pixels required is one-third of that of a color display panel using a color filter and the like, the capacity can be increased, the aperture ratio is tripled, and the number of signal drivers decreases to one-third. Therefore, a color display apparatus which has low power consumption and bright display, and which is thin and inexpensive, preferably, a direct-view-type color display apparatus can be realized.

Still furthermore, in the display apparatus of the present invention, the following preferred modes are provided.

In the above display apparatus, preferably, the plurality of luminescent materials and correspondingly at least one of the first and second electrodes are patterned in the shape of stripes. With this construction, electrode wiring can be linearized, and wiring resistance can be decreased. For this reason, a display apparatus having excellent luminous efficiency can be realized.

In the above display apparatus, preferably, the luminescent materials having three or four different luminescent colors are independently separated, formed into films, and patterned to form luminescent layers so as to become independent luminescent regions, the first and second electrodes are patterned so that they are each divided into two, and an electrode to which a voltage is to be applied is selected from the divided-in-two first and second electrodes, thereby selectively applying a voltage to each of the color luminescent layers. With this construction, the luminescent layers of three or four colors can be easily and independently illuminated and controlled. Therefore, an inexpensive display apparatus can be realized.

In the above display apparatus, preferably, metal wiring is formed in contact with the first electrode. With this construction, an increase in resistance of the first electrode due to patterning can be avoided, and a display apparatus having excellent luminous efficiency can be realized.

In the above display apparatus, preferably, a color filter is arranged on the light emitting side as seen from the luminescent layers. With this construction, the color purity of the luminescent colors can be further increased.

In the above display apparatus, preferably, a light diffusing layer is arranged on the light emitting side as seen from the luminescent layers. In this mode, a pattern of the light source of the backlight can be obscured to be inconspicuous. Therefore, a display apparatus of uniform display can be provided.

In the above display apparatus, a substrate for use in the light source preferably has light diffusibility. With this construction, the light diffusing layer and the substrate can be used in common, and a thin and lightweight display apparatus can be realized.

In the above display apparatus, preferably, when the luminescent materials are patterned to form luminescent layers, the luminescent materials are liquefied, and the luminescent layers are formed by a printing method or an ink jet method. With this construction, the light source can be prepared very simply without using vacuum process, and an inexpensive display apparatus can be provided.

In the above display apparatus, preferably, the product of each of the color luminescent materials at the same voltage and a luminescent area of each of the color luminescent layers is set to a value by which white balance can be achieved. With this construction, when the luminance materials having different luminance characteristics are used in combination, the driving voltages of the light source portion can be combined into one voltage while achieving white balance, thereby simplifying a circuit.

In the above display apparatus, preferably, the luminescent materials may include compounds, or organic polymers. With this construction, the voltage for driving the light source, and the power consumption can be dramatically reduced, and therefore a display apparatus having low power consumption can be provided.

In the above display apparatus, preferably, in the plurality of luminescent materials, at least one luminescent material is patterned and formed, and then a luminescent material emitting light of a wavelength shorter than that of the luminescent material is formed into a film on the entire surface to form a luminescent layer. With this construction, the required number of patterning is less than the number of luminescent materials by one time, and therefore a display apparatus can be realized at low cost.

In the above display apparatus, preferably, the plurality of luminescent layers, more preferably, organic luminescent layers are formed in the shape of stripes and in a plurality of repetition units of a set of colors, and a pitch p of each of the color stripe sets and a distance d between a light shutter surface (optical modulation surface) of the planar optical modulation panel and the luminescent layers have the relation represented by the expression p/d<1.1. With this construction, the stripes of the light source can be made inconspicuous, and therefore a display apparatus capable of performing uniform display can be realized.

In the above display apparatus, preferably, a liquid crystal light valve is used as the planar optical modulation panel, a quarter-wave plate is inserted between the light source and the liquid crystal light valve, and a drawing axis f the quarter-wave plate is inclined about 45 degrees with respect to a polarization direction of the polarizer of the liquid crystal light valve contacting the quarter-wave plate. With this construction, most of external light entering from the surface of the display apparatus can be absorbed, and contrast can be dramatically increased.

In the above display apparatus, preferably, organic compounds or organic polymers are used as the luminescent layers in the surface light source, and aligned in a uniaxial direction, a liquid crystal light valve is used as the planar optical modulation panel valve, and a polarization direction of light emitted from the light source is allowed to coincide with a polarization direction of a light-source-side polarizer of the liquid crystal light valve. With this construction, the light emitted from the light source has polarization property and can efficiently pass through the polarizer of the liquid crystal light valve and therefore, the loss of light emission can be reduced.

The display apparatus as described above is applicable to either of a direct-view-type and a projection type. In particular, it is possible for the display apparatus to be used as a direct-view-type display apparatus utilizing the advantage of a reduction in size and thickness of the surface light source, and to realize a lightweight information apparatus having a simple structure.

A preferred mode for carrying out the present invention will now be described with reference to more specific examples.

EXAMPLE 1

This example shows color display performed by a series of the following operations of: superimposing a light source having a structure in which a plurality of luminescent materials having different luminescent colors are arranged as a periodic alignment of a specific pattern within one plane on a substrate having a transparent first electrode patterned thereon and a second electrode is formed on a luminescent layer including each of the luminescent materials, and including a device for applying a voltage sufficient to emit light between the selected first and second electrodes in a selected period, on a planar optical modulation panel; dividing one scanning period of a color image into three periods; illuminating a light source with the first color in the first period; forming, in synchronism therewith, brightness information of the first color by the planar optical modulation panel; illuminating the light source with the second color in the second period; forming, in synchronism therewith, brightness information of the second color by the planar optical modulation panel; illuminating the light source with the third color in the third period; and forming, in synchronism therewith, brightness information of the third color by the planar optical modulation panel.

Figure 2:
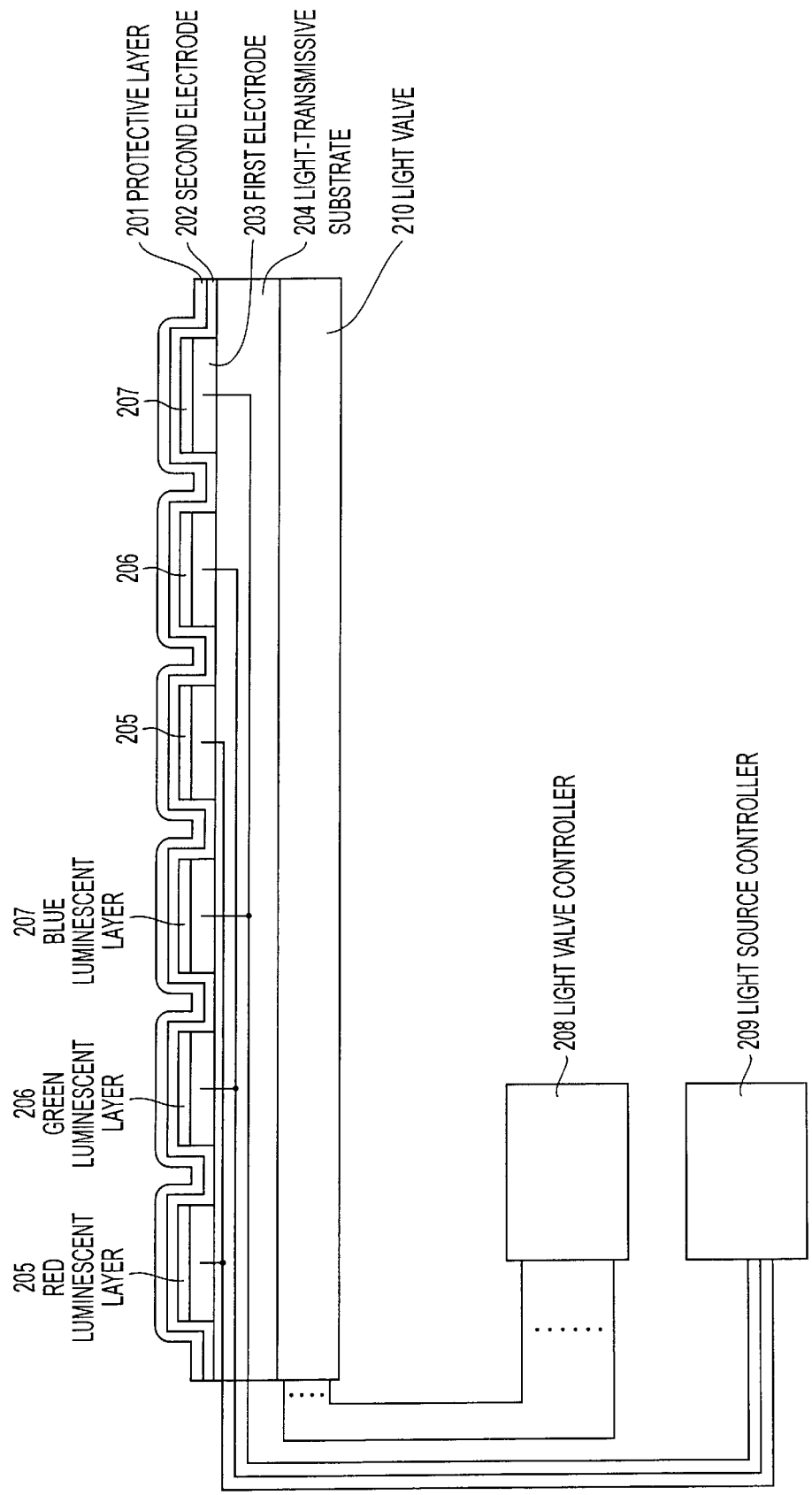
FIG. 2 is a view showing the cross-sectional structure and the connection of the display apparatus of Example 1.

FIG. 1 schematically shows the planar structure of a light source portion of this example, and FIG. 2 shows the vertical cross-sectional structure of a central portion of the structure in FIG. 1.

First, an ITO film was formed and patterned on a transparent substrate 109 (204) as a first electrode to obtain a first electrode (for blue) 101, and a first electrode (for green) 103 (203). Next, an insulating film 105 was formed on the entire surface of the substrate and patterned, and a first electrode (for red) 102 (203) was formed and patterned thereon. Then, red, green, and blue luminescent materials were sequentially formed and patterned on the ITO electrode along each of the first electrodes to obtain a red luminescent layer 106 (205), a green luminescent layer 107 (206), and a blue luminescent layer 108 (207). While the number of repetitions of lines of the electrodes 101, 102, and 103, that is, the number of stripes, is three in FIG. 1 for the purpose of simplification (two in FIG. 2 on account of limited space), the number of repetitions was actually fifty. Then, a second electrode 104 (202) was formed so as to cover the entire surface of the first electrodes and the luminescent layers. Furthermore, the thus-prepared first and the second electrodes of the light source were wired, and the second electrode was sealed by a protective layer 201. The wiring of the above electrodes was connected to a light source controller 209.

The light emitting side of the thus-prepared light source was superimposed on the back of a light valve 210 serving as the planar optical modulation panel, and the light valve 210 was connected to a light valve controller 208. Here, the light valve is one in which a member and an external field were driven so as to modulate light from the light source to thereby vary optical characteristics, and a liquid crystal panel or the like is used therefor.

Figure 3:
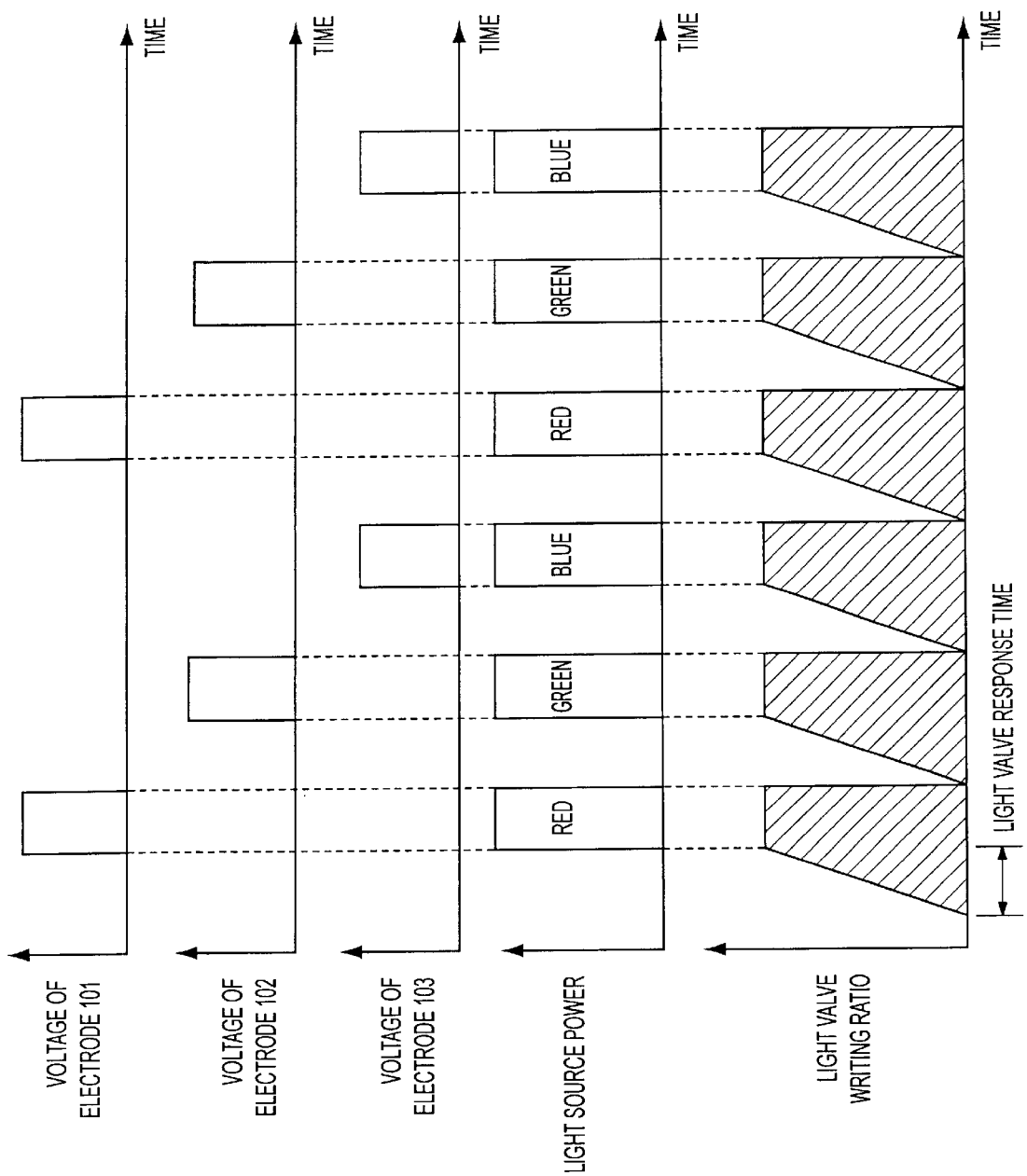
FIG. 3 is a diagram showing driving waveforms of a light source when driving the display apparatus of Example 1, and the associated light source power and transmittance of an optical modulation panel.

FIG. 3 shows the relationship between the luminous power of the light source and the driving of the light valve. The driving will be described. In particular, when a liquid crystal panel as the light valve is matrix-driven, a fixed period is required for full-screen writing because of a slow response speed of liquid crystal to the applied voltage. The period is called the light valve response time. After writing brightness information of each color to the light valve, the light source is allowed to emit light with corresponding colors. During the time the information is written to the light valve, the light source is switched off. For this reason, since display is not performed during the light valve response time, the brightness of the display apparatus becomes dark if the response time is long. in order to shorten the response time, if the display of the light valve is reset in a short time to start writing before the start of the display of each color, the light valve response time can be shortened. This allows the R, G, and B information to be serially switched and displayed at a high speed, and color display can be performed.

While a glass substrate was used in this example, a substrate such as a plastic film can be used as long as it can transmit light.

While the ITO was used for the transparent electrode in this example, a material, such as a Nesa film or IDIXO (sold by Idemitsu Corporation), can be used as long as it is a conductive transparent material.

A material (such as a metallic material) which is the most suitable for the second electrode is used in conformity with the luminescent layer used.

As the luminescent substance, that is, the luminescent material used in this example, a material, such as an inorganic EL (electroluminescence) material, an organic EL (electroluminescence) material, or a polymer EL (electroluminescence) compound can be used as long as it emits light by the application of an electric field.

As the planar optical modulation panel used in this example, a liquid crystal light valve using liquid crystal, such as nematic liquid crystal, ferroelectric liquid crystal, or polymer dispersed liquid crystal can be used as long as it has a function of optically modulating external light by varying optical characteristics by the driving by applying an external field.

In this example, the above plurality of luminescent materials and at least one of the corresponding first and second electrodes were patterned in the shape of stripes, and the luminescent regions were formed in the shape of stripes. However, even if luminescent regions having a structure other than stripes is used, as described hereinbelow, a similar display can be performed.

While the light source of three colors was used in this example, the color display can be performed by dividing one scanning period of the planar optical modulation panel into a number equal to that of the luminescent colors of the light source, illuminating the light source with a color corresponding to each of the divided color display periods, and displaying, in synchronism therewith, brightness information of the color by the optical modulation panel.

EXAMPLE 2

In this example, the above luminescent materials having three or four different luminescent colors are independently separated, formed into films, and patterned to form independent luminescent layers for each of the colors, the first and second electrodes are patterned so that they are each divided into two, and an electrode to which a voltage is to be applied is selected from the divided-in-two first and second electrodes, thereby selectively applying a voltage to each of the above color luminescent layers.

Figure 4:
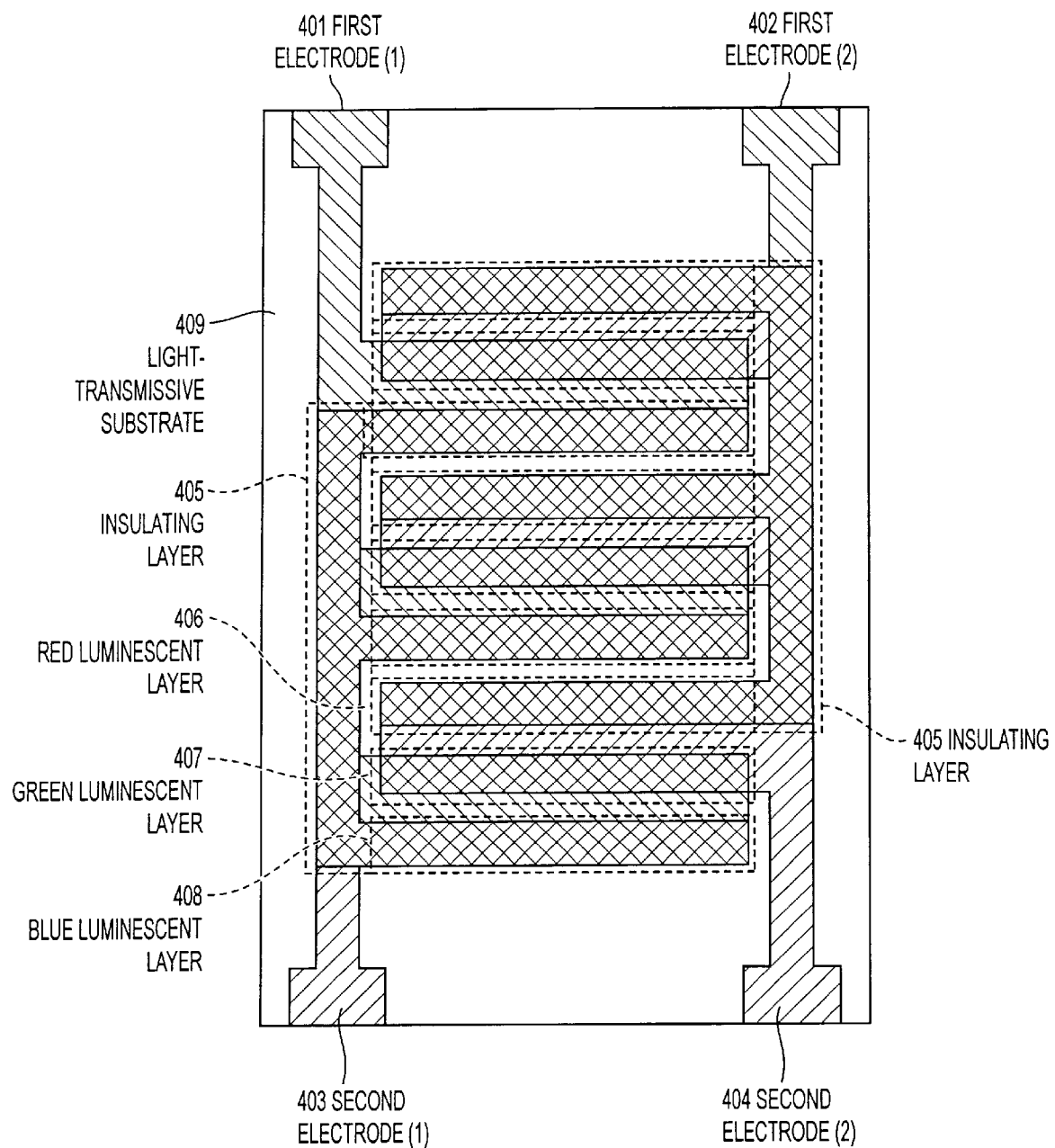
FIG. 4 is a plan view showing the structure of a light source portion of a display apparatus of Example 2.

FIG. 4 shows the planar structure of a light source portion of a display apparatus of this example. The same materials and methods as those in Example 1 were used except the method of forming the second electrodes.

Firstly, first electrodes were patterned in a manner of a first electrode (1) 401 and a first electrode (2) 402, as shown in FIG. 4. An insulating layer 405 was formed and patterned on sections of the first electrodes to be superposed on second electrodes. Next, a red luminescent layer 406, a green luminescent layer 407, and a blue luminescent layer 408 were formed and patterned. Then, a second electrode (1) 403 and a second electrode (2) 404 were formed by patterning deposition, as shown in the figure, through a physical mask. In this way, the red luminescent layer 406 was sandwiched between the first electrode (2) 402 and the second electrode 404 (2), the green luminescent layer 407 was sandwiched between the first electrode 401 (1) and the second electrode 404 (2), and the blue luminescent layer 408 was clamped between the first electrode (1) 401 and the second electrode (1) 403. Thereafter, the procedure advanced to sealing in a manner similar to Example 1.

Figure 5:
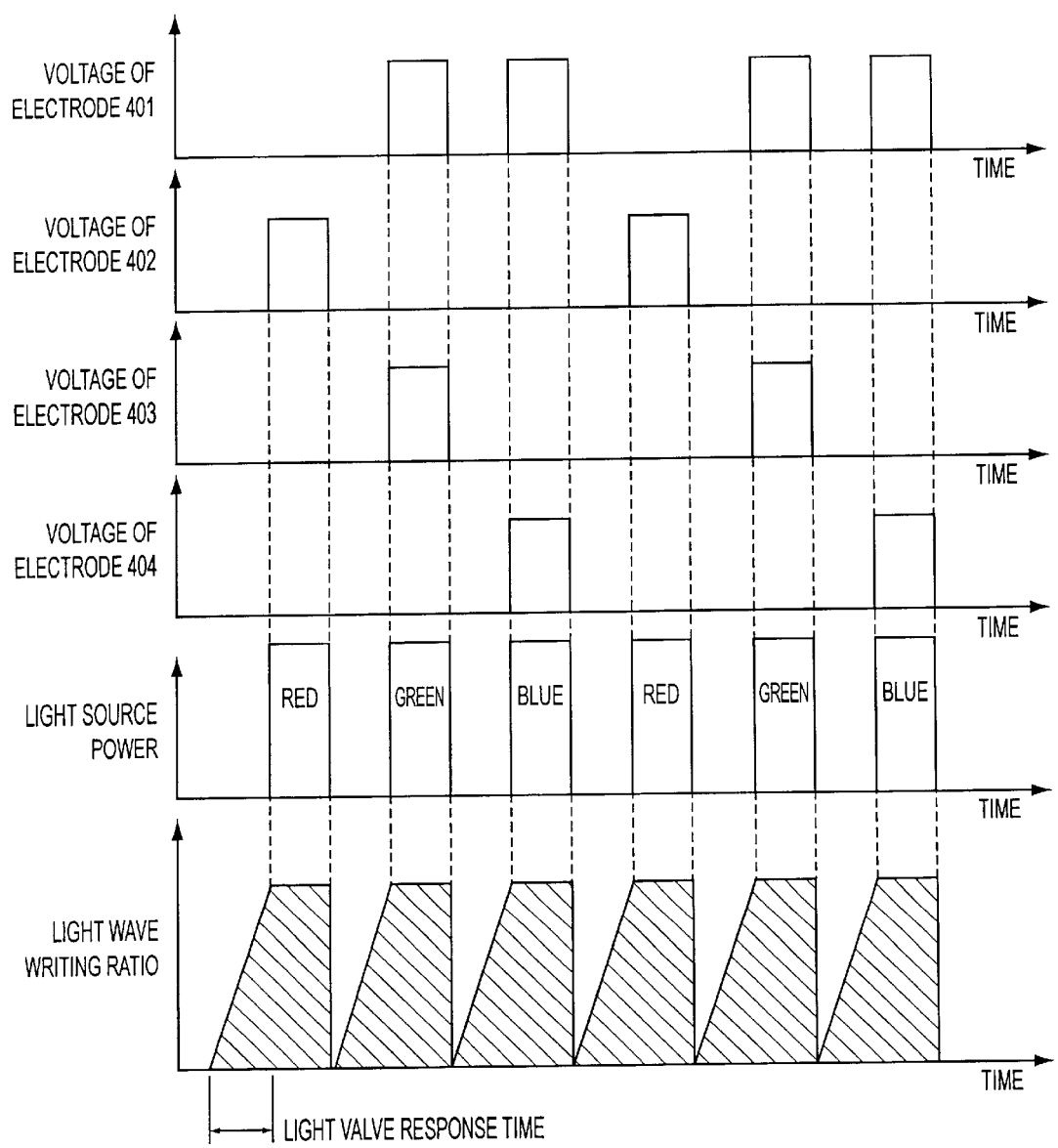
FIG. 5 is a diagram showing driving waveforms of a light source when driving the display apparatus of Example 2, and the associated light source power and transmittance of an optical modulation panel.

Next, the display apparatus was connected to a driving circuit, and was driven by driving waveforms shown in FIG. 5. The driving will be described. In particular, when a liquid crystal panel is used as a light valve serving as a planar optical modulation panel, it takes time for full-screen writing because of a slow response speed. The period is called the light valve response time. After writing brightness information of each color, the light source is allowed to emit light in corresponding colors. During the period the brightness information is written to the liquid crystal panel, the light source is switched off. For this reason, since display is not performed during the liquid crystal panel response time, the brightness of the display apparatus becomes dark if the response time is long. In order to shorten the response time, if the display of the liquid crystal panel is reset in a short time to start writing before the start of the display of each color, the light valve response time can be shortened.

In this example, in order to allow the light source to emit light, the first electrodes were divided into the electrode 401 and the electrode 402, and the waveforms shown in FIG. 5 were applied thereto. On the other hand, the second electrodes were divided into the electrode 403 and the electrode 404, and the waveforms shown in FIG. 5 were applied thereto to select the color of the light to be emitted. This allows red, green, and blue light to be efficiently emitted in that order.

While the physical mask was used as a method for patterning the second electrodes, any method, such as an electrode separation wall having a reverse-tapered structure, can be used as long as it can separate electrode films.

In this example, three luminescent colors were described. However, when a four-color light source is driven, different driving waveforms are applied to the electrodes after changing patterns of electrodes, whereby four-color driving can be achieved.

EXAMPLE 3

In this example, metal wiring is formed in contact with the above first electrodes with the structure of Example 1 or Example 2.

Figure 6:
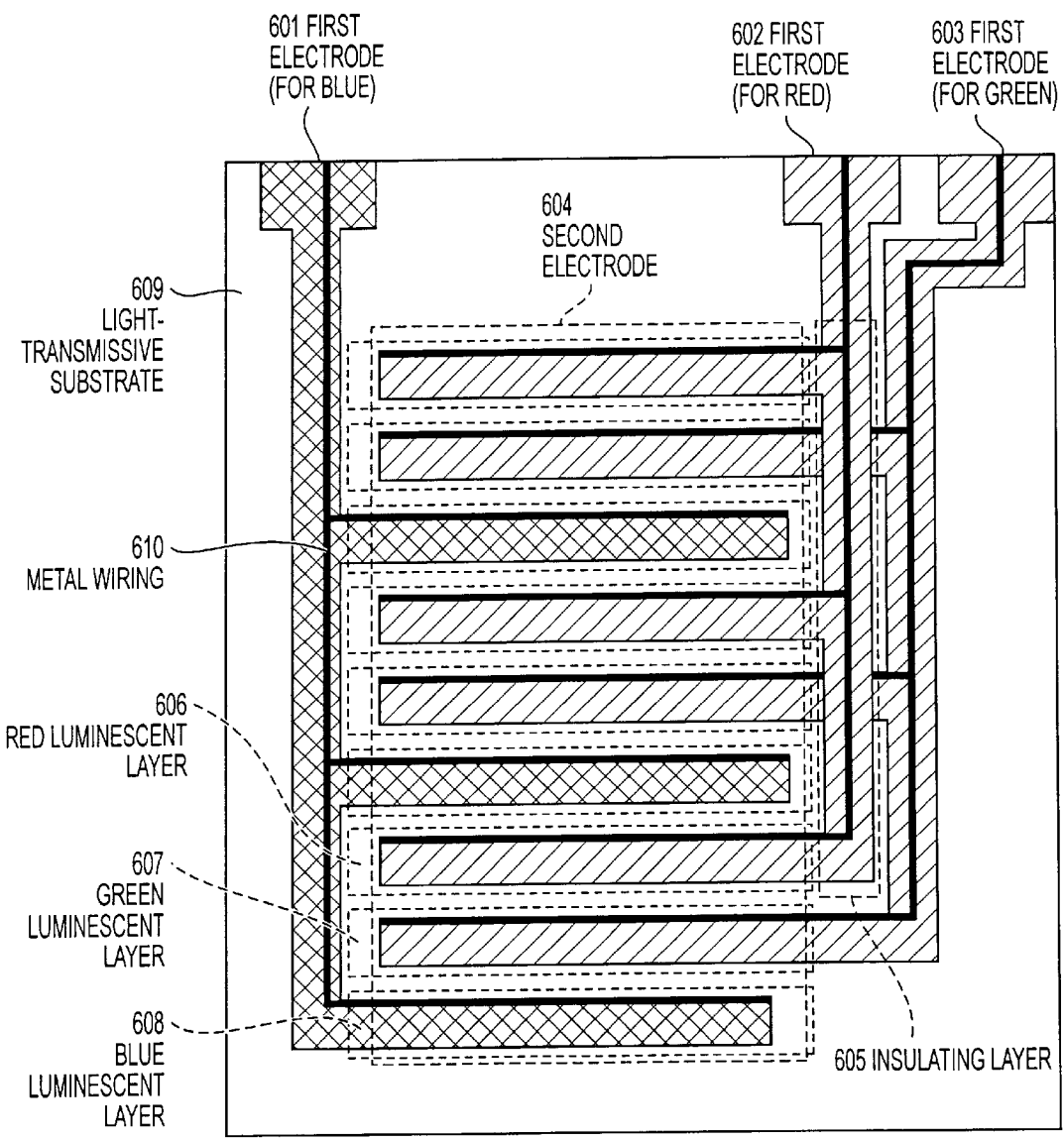
FIG. 6 is a plan view showing the structure of a light source portion of a display apparatus of Example 3.

FIG. 6 shows the planar structure of a light source portion of a display apparatus of this example. The display apparatus was basically manufactured in a manner similar to Example 1. After forming first electrodes (601, 602, and 603) including transparent conductive films and the like on a light-transmissive substrate 609, a metal film was formed, the metal film was patterned by photolithography, and metal wiring was provided thereon to reduce resistance of the first electrodes. In a region where the first electrodes are superimposed, an insulating layer 605 was provided to insulate the first electrodes from one another. In succession, a red luminescent layer 606, a green luminescent layer 607, and a blue luminescent layer 608 were provided in accordance with the form of the patterns of the first electrodes, and second electrodes (not shown) were provided. With such a structure, a reduction in driving voltage during the driving could be prevented, and brightness uniformity in the display apparatus could be increased.

In this example, a metal which has low resistance and is easily patterned, such as gold, silver, copper, or aluminum, can be used for the wiring.

While the metal wiring was formed after forming the transparent electrodes in this example, the metal wiring may be formed before forming the transparent electrodes.

EXAMPLE 4

Figure 7:
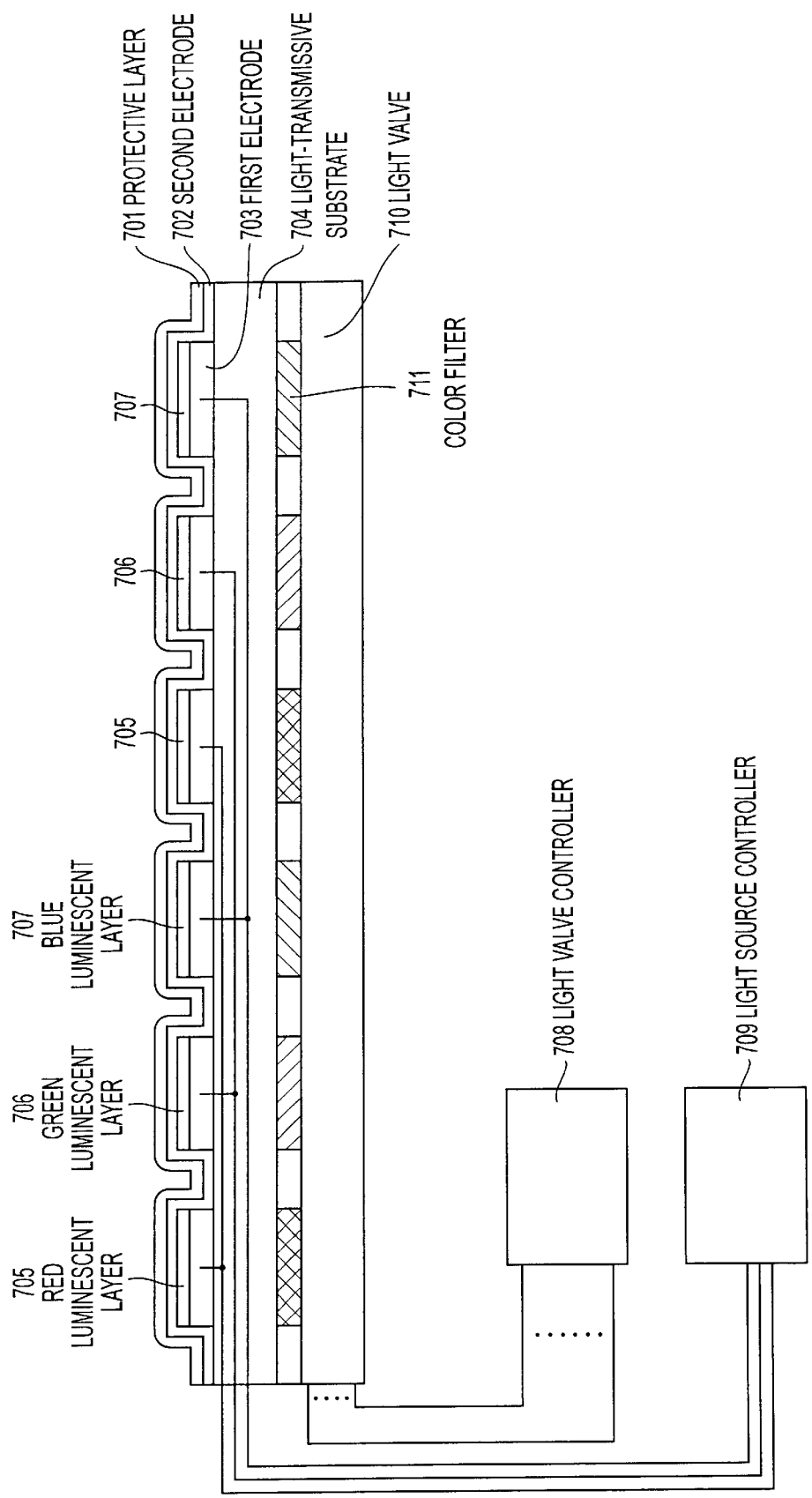
FIG. 7 is a view showing the cross-sectional structure and the connection of a display apparatus of Example 4.

In this example, color filters are further arranged on the light emitting side as seen from the luminescent layers with the structure of Example 1. FIG. 7 shows the cross-sectional structure of a display apparatus of this example.

First, red (R), green (G), and blue (B) color filters 711 were formed on the opposite side of a light source member of a transparent substrate at positions corresponding to those where each of the luminescent layers are to be formed, and transparent conductive films serving as first electrodes were formed and patterned in accordance with the patterns of each of the color filters. By the method and structure similar to those of Example 1, a display apparatus having the cross-sectional structure shown in the figure was obtained on the substrate.

In this example, when the luminescent layers had insufficient color purity, color correction could be made by the color filters, and chromaticity equal to NTSC chromaticity could be realized.

While the R, G, and B color filters were used in this example, the colors of the color filters may be controlled in accordance with the luminescent colors of the luminescent layers.

EXAMPLE 5

Figure 8:
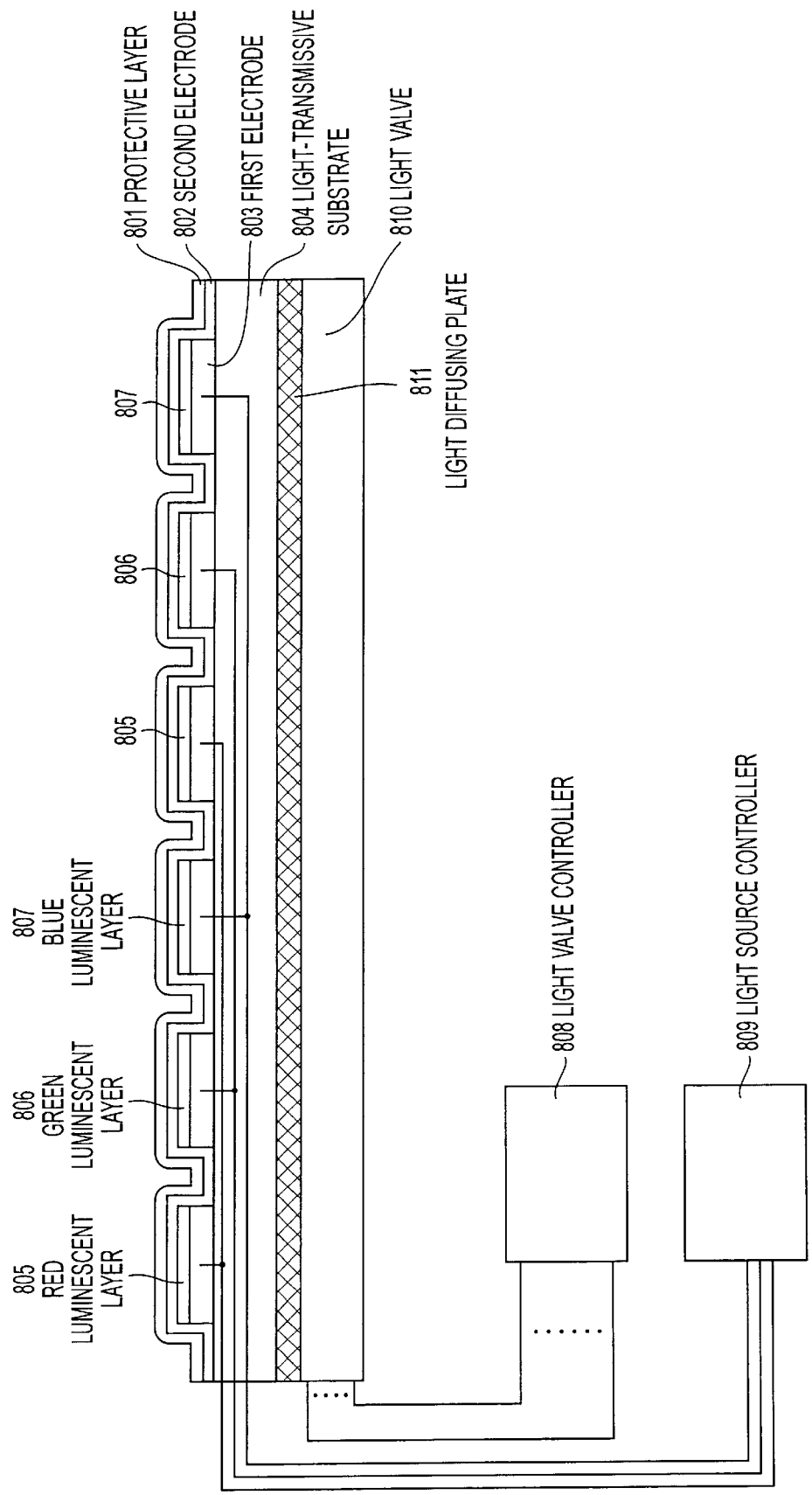
FIG. 8 is a view showing the cross-sectional structure and the connection of a display apparatus of Example 5.

In this example, a light diffusing plate is arranged on the light emitting side as seen from the luminescent layers with the structure of Example 1. FIG. 8 shows a cross-sectional structure of a display apparatus of this example. A light diffusing plate 811 is arranged on the light emitting side (between a light-transmissive substrate 804 and a light valve 810) of the light source prepared in Example 1.

This allows boundaries of R, G, and B luminescent sources to be moderately obscured, and the entire light source surface appears to be illuminated with R, G, and B even if the display apparatus is directly viewed.

EXAMPLE 6

Figure 9:
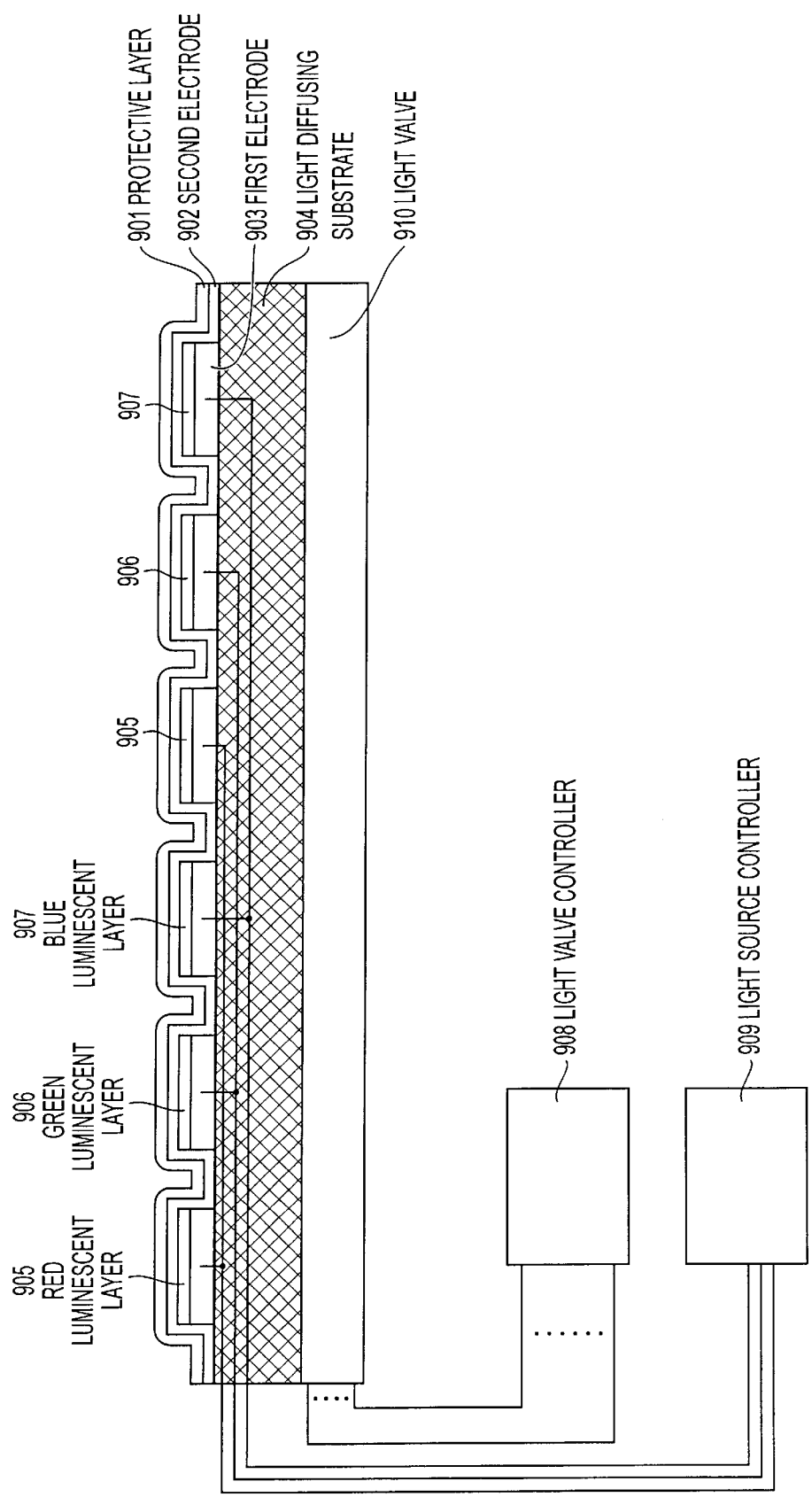
FIG. 9 is a view showing the cross-sectional structure and the connection of a display apparatus of Example 6.

In this example, a substrate of a light source in the idea similar to Example 5 having light diffusibility is used. FIG. 9 shows the cross-sectional structure of a display apparatus of this example.

A light source was prepared in a manner similar to Example 1 except that a light diffusing plate 904 was used as the light-transmissive substrate of Example 1. This allowed color luminescent sources to be obscured very simply. Since the number of members was not increased, display quality could be improved with a thin and light-weight display apparatus.

EXAMPLE 7

Figure 10:
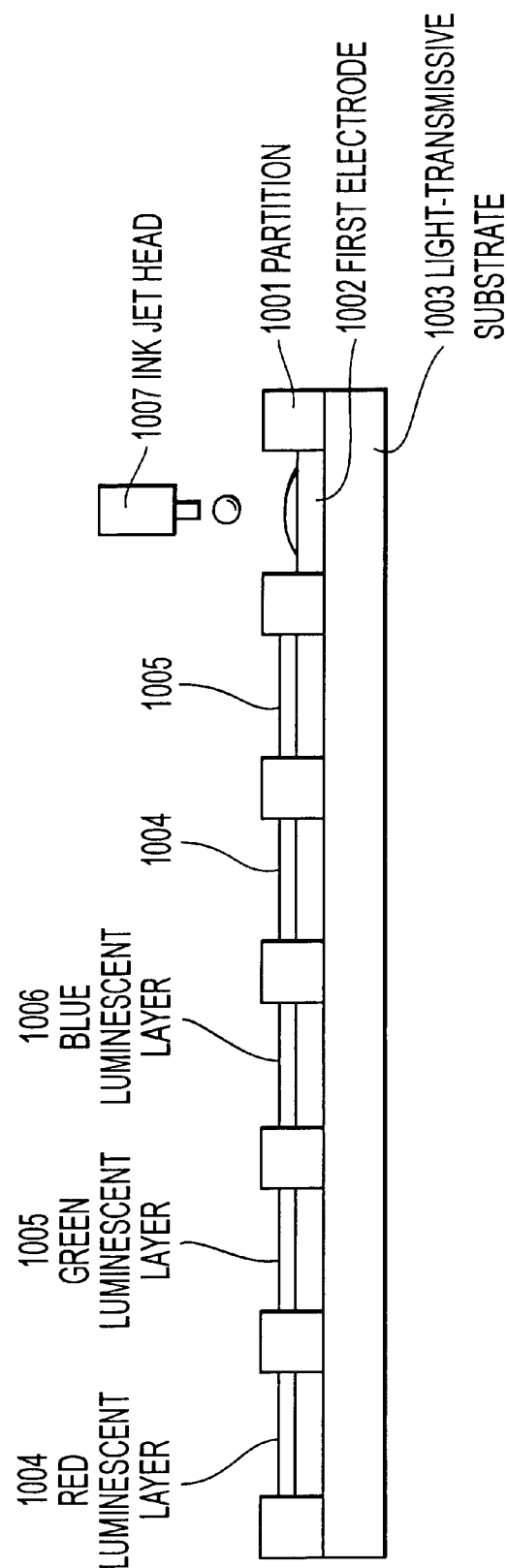
FIG. 10 is a sectional view showing the manufacturing process of a display apparatus of Example 7.

In this example, when the luminescent materials in the light source of the display apparatus of the above examples are patterned to form luminescent layers, the luminescent materials are liquefied and a printing method or an ink jet method is used. FIG. 10 shows the concept of the formation of luminescent layers of a light source of a display apparatus of this example using an ink jet method.

First, a transparent electrode was formed and patterned on a light-transmissive substrate 1003 to provide a pattern of a first electrode 1002, and partitions 1001 were provided between the electrodes. Next, luminescent layers (a red luminescent layer 1004, a green luminescent layer 1005, and a blue luminescent layer 1006) were sequentially formed on the electrode 1002 by the ink jet method, as shown in the figure. Furthermore, second electrodes and thereafter were prepared.

With this construction, a light source portion can be prepared very simply without using vacuum process.

A conventional printing method can be used instead of the ink jet method. While organic materials capable of being liquefied were used as luminescent materials in this example, even inorganic materials can form the luminescent layers as long as they can be liquefied. For example, an alkoxylated metal can be used because it dissolves in alcohol. After being applied, the metal may be burned to remove the alkoxy group.

When the second electrodes are also patterned as in the structure of the surface light source in Example 2, they can be patterned using the partitions 1001 in this example upon cathode deposition.

EXAMPLE 8

Figure 11:
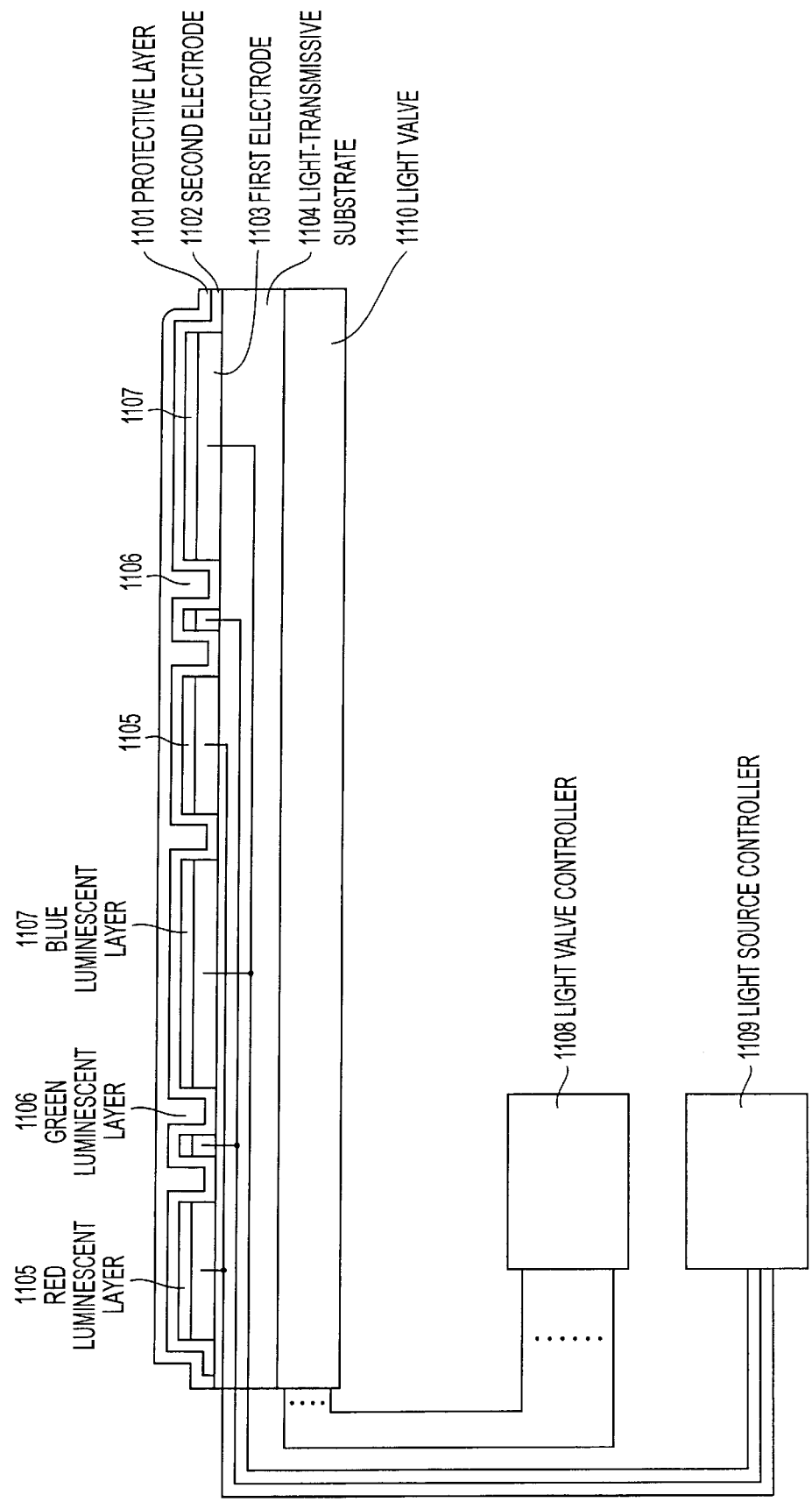
FIG. 11 is a view showing the cross-sectional structure and the connection of a display apparatus of Example 8.

This example may be provided such that the product of luminance of each of the above color luminescent materials at the same voltage and the luminescent area of each of the color luminescent layers is set to a value by which white balance can be achieved. FIG. 11 shows the cross-sectional structure of a display apparatus of this example.

Red, green, and blue luminescent materials in the luminance ratios 1:10:2 at a voltage of 5V were used in this example. It is generally known that white balance is achieved, that is, the color appears as white to a human, when the red, green, and blue are in the luminance ratios 3:12:10. Thus, taking x, y, and z as luminescent areas of red, green, and blue, respectively, the ratios of x:y:z of 3:1.2:5 were obtained when $1 \times x=3$, $10 \times x=12$, and $2 \times x=10$. The ratios were ratios of the luminescent of each of the colors. FIG. 11 shows a red luminescent layer (1105), a green luminescent layer (1106), and a blue luminescent layer (1107) in which the luminescent areas are controlled by varying the planar areas thereof. Other structural portions of the display apparatus shown in the figure are substantially similar to those in Example 1.

With this construction, when the luminescent materials having different luminance characteristics are used in combination, the driving voltages of the light source portion can be combined into one voltage while achieving white balance, thereby simplifying a circuit.

EXAMPLE 9

In this example, the above luminescent materials may include organic compounds, or organic polymers.

The following hole injection layer and luminescent layers were formed as the luminescent layers of Example 1, and the following cathodes were formed as the second electrodes. The drive voltage was a DC voltage of 5V, and a light source controller was very simple because it was a DC switching circuit. The power consumption was 0.5 W at the luminance of 100 Cd/m$^2$.

While the hole injection layer was formed of a triphenyl amine derivative, another material can be used as long as it has a similar effect. For example, TPD, TAD, or m-MTDATA can be used.

In addition, any material can be used as long as it is a conductive derivative of phthalocyanine, polythiophene, polyaniline, or polyvinylcarbazole and it can be easily formed into a film.

As regards the luminescent layers, Alq3 doped with DCM was used as a red luminescent material, Alq3 doped with rubrene was used as a green luminescent material, and DPVBi was used as a blue luminescent layer. However, any luminescent material can be used as long as it can be formed into a film using vacuum deposition. Other luminescent materials can be used as long as they can form luminescent layers by a method other than vacuum deposition.

The cathodes having an alloy of Mg and silver deposited thereon can be used. However, the cathodes may be formed by a wet method, such as sputtering and plating. In addition, other cathodes can be used as long as they include an element, such as Ca, Li, or Al, having a work function smaller than that of anodes serving as first electrodes.

EXAMPLE 10

Figure 12:
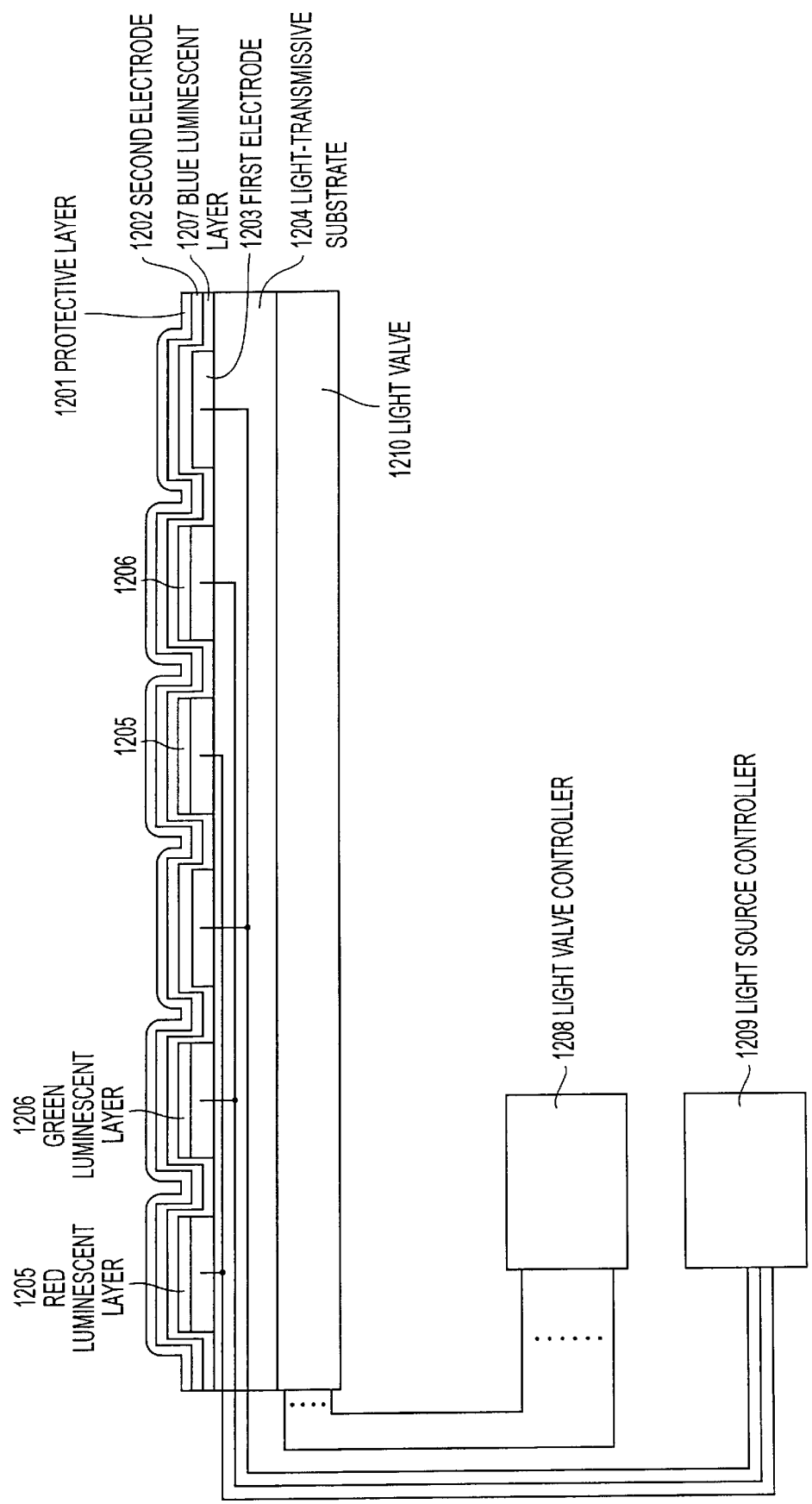
FIG. 12 is a view showing the cross section and the connection of a display apparatus of Example 10.

In this example, in the plurality of luminescent materials in Example 9, at least one luminescent material is patterned, and then a luminescent material which emits light having a wavelength shorter than that of the above luminescent material is formed into a film on the entire surface of the above luminescent material to form a luminescent layer. FIG. 12 shows the cross-sectional structure of a display apparatus of this example.

A first electrode 1203 including transparent conductive film, such as ITO, was formed and patterned on a light-transmissive substrate 1204, and red and green luminescent materials were sequentially formed and patterned thereon by an ink jet method to obtain a red luminescent layer 1205 and a green luminescent layer 1206. Next, a blue luminescent layer 1207 was formed by coating a blue luminescent material on the entire surface thereof, a second electrode 1202 was formed, and was then sealed to form a protective layer 1201. The above method was performed in a manner similar to Example 1.

According to the method, the need for patterning the blue luminescent material is eliminated. In the red and green luminescent regions, blue light emitted from the blue luminescent layer 1207 excites the red or the green luminescent layer (1205 or 1206) to be converted into red or green light. Alternatively, electrons passing through the blue luminescent layer combine with holes in the red or the green luminescent layer to excite the red or the green luminescent layer, and red or green light is emitted.

In this example, a general printing method or vacuum deposition can be used instead of the ink jet method. In forming the blue luminescent layer, vacuum deposition, spin coating, or a printing method can be used.

EXAMPLE 11

Figure 13:
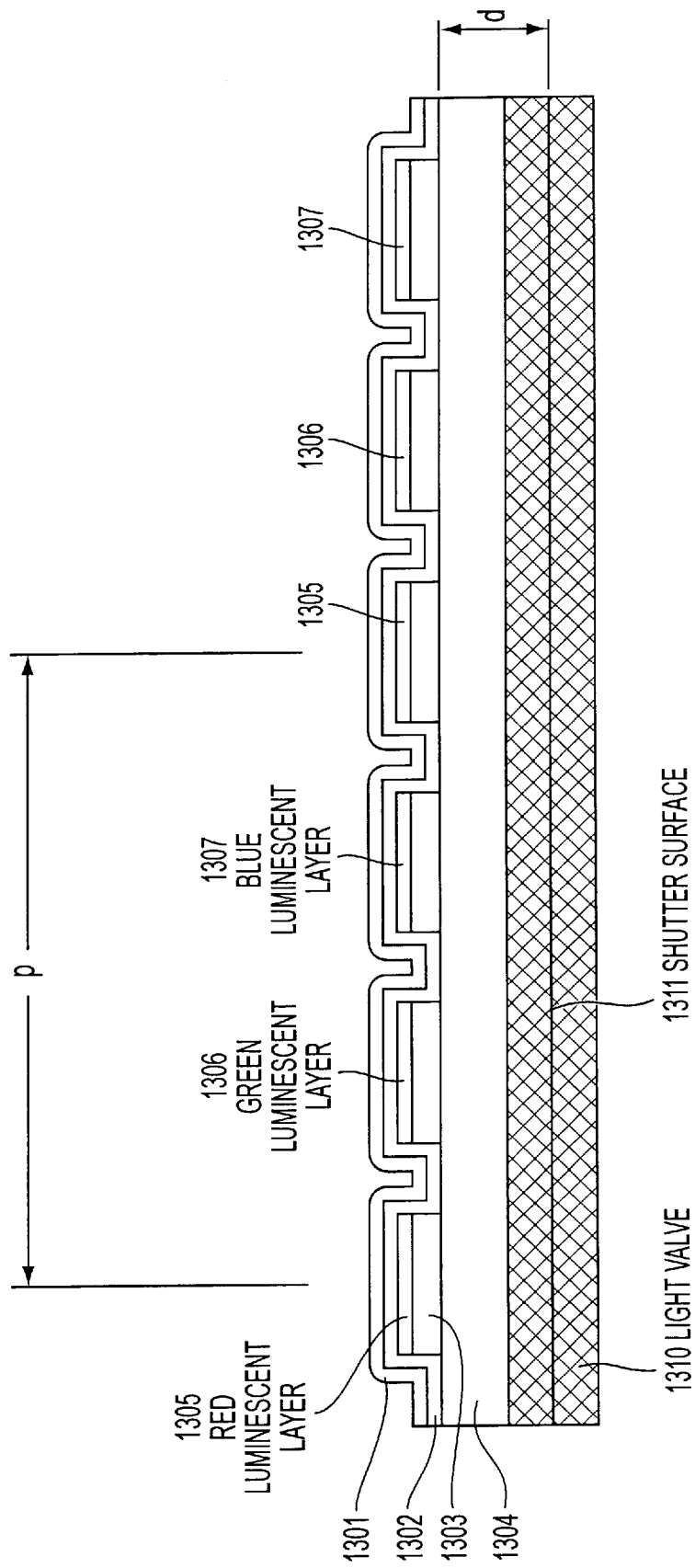
FIG. 13 is a sectional view showing the structure of a display apparatus of Example 11.

In this example, a plurality of organic luminescent layers are formed in the shape of stripes, and a pitch p of one set of color stripes and a distance d between a light shutter surface of the above planar light valve and the above luminescent layers have the relation represented by the expression p/d<1.1. FIG. 13 shows the cross-sectional structure of a display apparatus of this example.

Since human eye cannot recognize the colors R, G, and B when variations in luminance of the colors R, G, and B are within 5%, the relationship between p and d which satisfies this condition is as described above. In the actual construction, ITO was formed and patterned in the shape of 400 μm-pitch stripes on a light-transmissive substrate 1304 having a thickness of 1 mm to obtain a first electrode 1303, and R, G, and B luminescent materials were applied and patterned thereon as stripes each having a width of 400 μm in a solution state by an ink jet method (a red luminescent layer 1305, a green luminescent layer 1306, and a blue luminescent layer 1307). After drying, a second electrode 1302 serving as a counter electrode was formed, and a protective layer 1301 was formed and sealed. When a liquid crystal light valve 1310 was arranged on the thus-prepared light source so that the distance d between a light shutter surface 1311 and the luminescent layers and the pitch p of one set of color stripes had the relation represented by the expression p/d<1.1, and was driven by a driving circuit similar to that of Example 1, uniform color display was sufficiently performed without using a diffusing plate. Of course, more uniform color display can be obtained by combining the luminescent layers with a diffusing layer. While the patterns in the shape of stripes were shown in this example, the patterns can be modified within the scope of this example.

EXAMPLE 12

Figure 14:
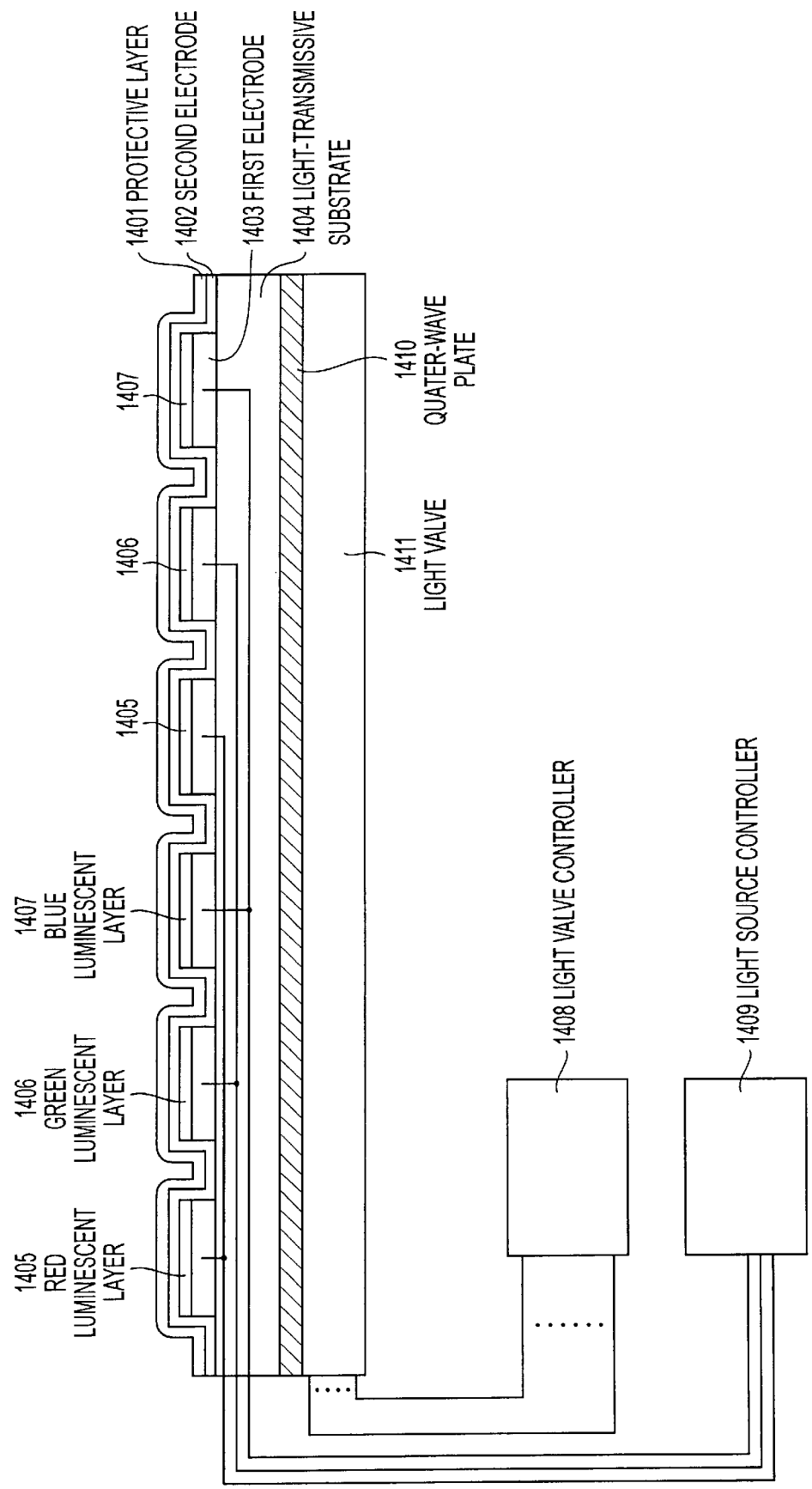
FIG. 14 is a view showing the cross-sectional structure and the connection of a display apparatus of Example 12.

In this example, the above planar optical modulation panel was a liquid crystal light valve, a quarter-wave panel was inserted between the above light source and the above liquid crystal light valve, and a drawing axis of the quarter-wave plate was inclined about 45 degrees with respect to a polarization direction of a polarizer of the liquid crystal light valve contacting the quarter-wave plate. FIG. 14 shows the cross section of a display apparatus of this example.

In the display apparatus prepared in this example, the basic structure of a surface light source portion is similar to the structure of the light source in Example 11. In this example, in the structure of Example 11, a quarter-wave plate was arranged between a light-transmissive substrate (1404) and a liquid crystal light valve (1411) by being inclined about 45 degrees with respect to a polarization direction of a polarizer of the liquid crystal light valve contacting the quarter-wave plate. This eliminated most of the reflection of external light, and the contrast became 50:1 or more. The insertion of the quarter-wave plate highly increases visibility.

If the surface of the display apparatus of this example is anti-reflection treated or anti-glare treated, the visibility can be further increased.

EXAMPLE 13

In this example, the luminescent layers in the above light source are organic compounds or organic polymers, and are aligned in a uniaxial direction, and a polarization direction of light from the above luminescent layers is allowed to coincide with a polarization direction of a light-source-side polarizer of a liquid crystal light valve. Basically, in a structure similar to Example 11, organic substances of the luminescent layers were aligned, and the luminescent layers were arranged so that a principal polarization direction of light from the luminescent layers coincided with a transmission axis of the polarizer of the liquid crystal light valve. This allowed applied electric energy to be efficiently converted into polarized light and applied to the light valve, and efficiency about twice the efficiency of the conventional display apparatus could be obtained.

EXAMPLE 14

Figure 15:
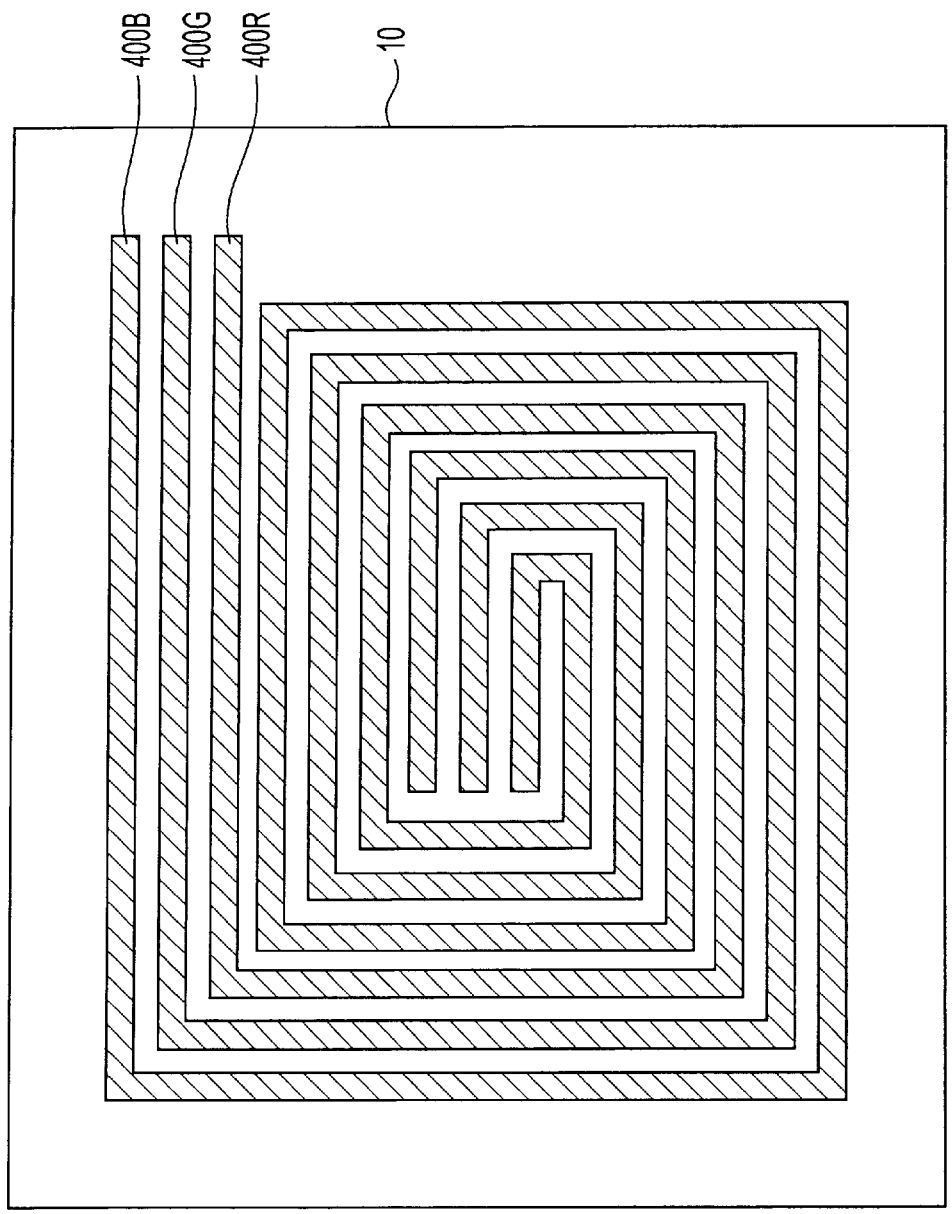
FIG. 15 is a plan view showing the form of patterns of a luminescent region of a surface light source in Example 14.

This example shows a modification of the form of patterns of luminescent regions in a surface light source having a plurality of luminescent regions used in combination with a planar optical modulation panel. FIG. 15 shows the form of patterns of luminescent regions in a surface light source of this example.

In the surface light source shown in the figure, a luminescent region 400R emitting red light, a luminescent region 400G emitting green flight, and a luminescent region 400B emitting blue light are spirally formed on a substrate 10. Each of the regions 400R, 400G, and 400B may preferably have a structure of an electroluminescent device (EL device) in which an organic or an inorganic luminescent material (luminescent layer) emitting each color light is sandwiched between a pair of first and second electrodes, and the structure of each of the EL devices may preferably have a spiral pattern form in plan view, as shown in the figure.

According to the above structure, a region in which electrode films (cathode films and anode films) constituting the luminescent devices cross on the substrate are eliminated, patterning of an insulating layer provided in such a crossing region is not required (for example, the insulating layer 105 shown in FIG. 1 is not required), and a manufacturing process of the surface light source is further simplified.

EXAMPLE 15

Figure 16:
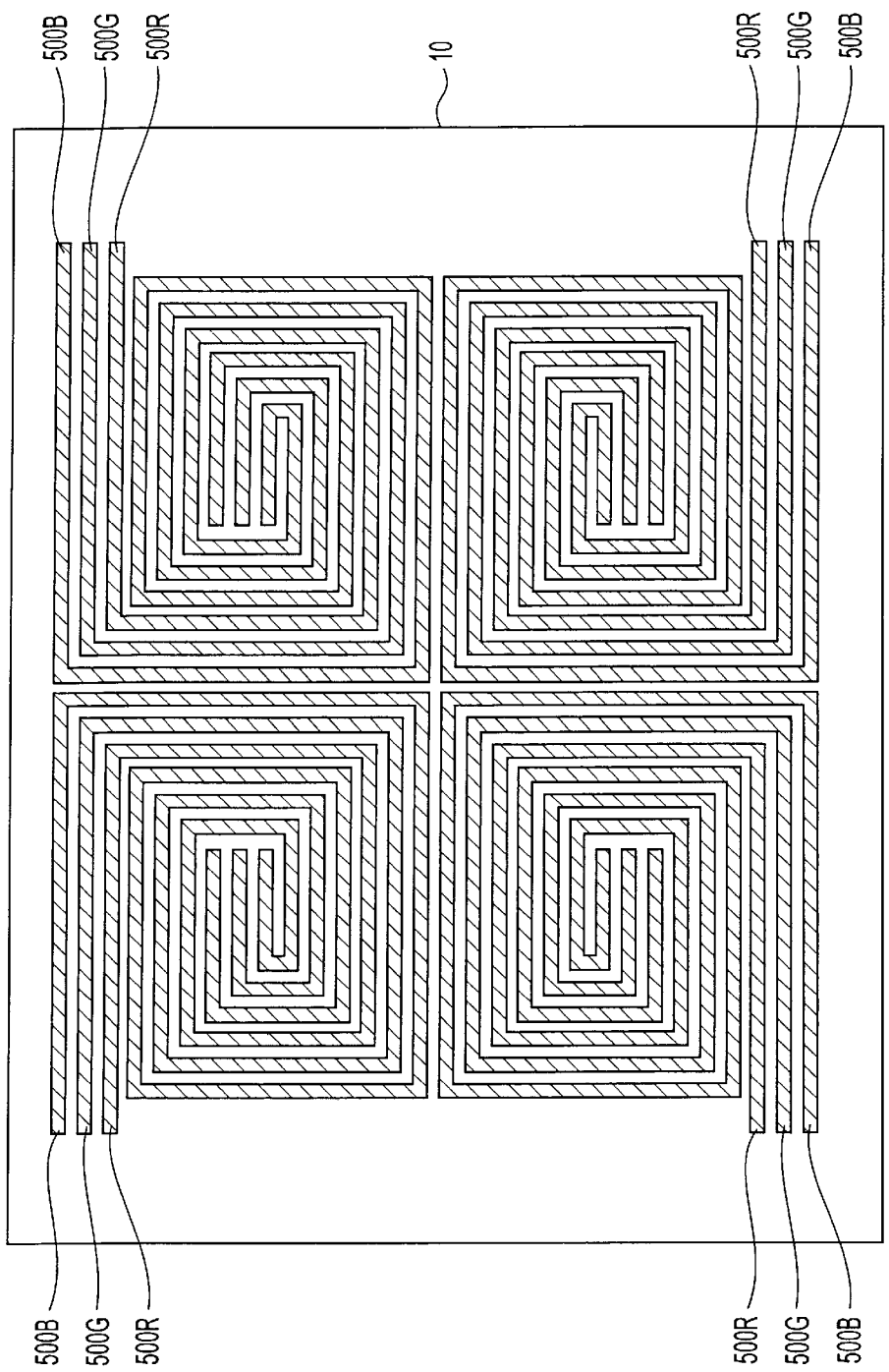
FIG. 16 is a plan view showing the form of patterns of a luminescent region of a surface light source in Example 15.

This example shows another modification of the form of patterns of luminescent regions in a surface light source having a plurality of luminescent regions that is used in combination with a planar optical modulation panel. FIG. 16 shows the form of patterns of luminescent regions in a surface light source of this example.

In the surface light source shown in the figure, a pattern in which a luminescent region 500R emitting red light, a luminescent region 500G emitting green light, and a luminescent region 500B emitting blue light are spirally formed on a substrate 10 is used as one unit, and four units of the patterns constitute a light source for emitting light over a required area. As in the case of Example 14, each of the regions 400R, 400G, and 400B of each of the units may preferably have a structure of an electroluminescent device (EL device) in which an organic or an inorganic luminescent material (luminescent layer) emitting each color light is sandwiched between a pair of first and second electrodes, and the structure of each of the EL devices may preferably have a spiral pattern form in plan view, as shown in the figure.

Furthermore, an electric current for allowing the EL devices to emit light is supplied from four sections, one for each unit, that is, from portions near the four corners of the substrate 10 in the example of FIG. 16. The length of a linear pattern of the EL device can be shortened by dividing the spiral device rather than by forming a desired luminescent area by continuous spiral devices. That is, a voltage drop or heat generation due to the electrodes constituting the EL devices or the resistance of the wiring can be suppressed.

As described above, according to the present invention, the display apparatus using the time-divided color light source includes the planar optical modulation panel and the surface light source, and luminescent regions including organic or inorganic EL devices are used as the surface light source, whereby power consumption is reduced, and the display apparatus can become very compact. The color purity can be simultaneously increased, and contrast can be dramatically increased.

In addition, in the present invention, in particular, when the luminescent regions are formed by EL devices, the use of the spiral forms in plan view as the form of patterns of the luminescent regions in the surface light source can realize a light source which has a simple structure and in which wiring resistance or unnecessary heat generation is suppressed.

Industrial Applicability

The display apparatus of the present invention is suitable for use in an electronic device, such as a laptop personal computer (PC) for which high quality image display is required, a television, a view-finder-type or a monitor-direct-view-type video tape recorder, a car navigation apparatus, an electronic notebook, an electronic calculator, a word processor, an engineering work station (EWS), a mobile phone, a picture telephone, a POS terminal, a pager, a apparatus including a touch panel, or a projection display apparatus, such as a liquid crystal projector.

What is claimed is:

1. A display apparatus comprising:

a planar optical modulation panel; and a surface light source arranged on the back of the planar optical modulation panel, and having at least a first luminescent region including a luminescent material emitting light with a first color and a second luminescent region including a luminescent material emitting light with a second color different from the first color in a surface substantially parallel to a surface of the planar optical modulation panel, one scanning period of a color image to be displayed being divided into the number of luminescent colors of the surface light source, each of the luminescent regions being allowed to emit light in accordance with each of the divided periods, brightness information of the luminescent color of the emitted light being formed by the planar optical modulation panel in synchronism with the periods, and the light of each color being optically modulated to perform a color display;

the surface light source having the first luminescent region and the second luminescent region with a structure in which a plurality of luminescent materials having different luminescent colors are arranged as a periodic alignment of a specific pattern within one plane on a substrate having a transparent first electrode formed thereon, a second electrode being formed on a luminescent layer including each of the luminescent materials and including a voltage source for applying a voltage sufficient to emit light between the selected first and second electrodes in a selected period;

the plurality of organic luminescent layers being formed in the shape of stripes and in a plurality of repetition units of a set of colors, and a pitch p of each of the color stripe sets and a distance d between a light shutter surface of the planar optical modulation panel and the luminescent layers having a relationship expressed by p/d<1.1.

2. The display apparatus as claimed in claim 1, the surface light source further comprising a third luminescent region including a luminescent material emitting light with a third color different from the first and second colors.

3. display apparatus as claimed in claim 2 the first, second, and third luminescent regions being a luminescent layer emitting red light, a luminescent layer emitting green light, and a luminescent layer emitting blue light.

4. The display apparatus as claimed in claim 1, having one scanning period of the color image being divided into the same number as the luminescent colors of the light source, the light source being illuminated with a color corresponding to each of the divided color display periods, and brightness information of the color is, in synchronism therewith, displayed by the planar optical modulation panel to thereby perform color display.

5. The display apparatus as claimed in claim 4, the plurality of luminescent materials and correspondingly at least one of the first and second electrodes being patterned in the shape of stripes.

6. The display apparatus as claimed in claim 4, the luminescent materials having three or four different luminescent colors being independently separated, formed into films, and patterned to form independent luminescent layers for each of the colors, the first and second electrodes being patterned so that they are each divided into two, and an electrode to which a voltage is to be applied being selected from the divided-in-two first and second electrodes, thereby selectively applying a voltage to each of the color luminescent layers.

7. The display apparatus as claimed in claim 4, metal wiring being formed in contact with the first electrode.

8. The display apparatus as claimed in claim 4, a color filter being arranged on the light emitting side as seen from the luminescent layers.

9. The display apparatus as claimed in claim 4, a light diffusing layer being arranged between the luminescent layers of the light source and the planar optical modulation panel.

10. The display apparatus as claimed in claim 9, a substrate for use in the light source being light-diffusible.

11. The display apparatus as claimed in claim 4, the luminescent materials being liquefied when the luminescent materials are patterned to form luminescent layers, and the luminescent layers being formed by one of a printing method and an ink jet method.

12. The display apparatus as claimed in claim 4, the product of each of the color luminescent materials at the same voltage and a luminescent area of each of the color luminescent layers being set to a value by which white balance can be achieved.

13. The display apparatus as claimed in claim 4, the luminescent materials include at least one of organic compounds and organic polymers.

14. The display apparatus as claimed in claim 13, in the plurality of luminescent materials, at least one luminescent material being patterned and formed, and then a luminescent material emitting light of a wavelength shorter than that of the luminescent material being formed into a film on the entire surface to form a luminescent layer.

15. The display apparatus as claimed in claim 4, a liquid crystal panel using a polarizer being used as the planar optical modulation panel, a quarter-wave plate being inserted between the light source and the liquid crystal panel, and a drawing axis of the quarter-wave plate being inclined about 45 degrees with respect to a polarization direction of the polarizer of the liquid crystal panel contacting the quarter-wave plate.

16. The display apparatus as claimed in claim 4, the luminescent layers in the surface light source including one of organic compounds and organic polymers, materials of the luminescent layers being aligned in a uniaxial direction, a liquid crystal panel being used as the planar optical modulation panel, and a polarization direction of light emitted from the light source being allowed to coincide with a polarization direction of a light-source-side polarizer of the liquid crystal panel.

17. The display apparatus as claimed in claim 1, the form of patterns of the color luminescent regions in the surface light source being a spiral form.

18. The display apparatus as claimed in claim 17, the surface light source further comprising a third luminescent region including a luminescent material emitting light with a third color different from the first and second colors.

19. The display apparatus as claimed in claim 18, the first, second, and third luminescent regions being a luminescent layer emitting red light, a luminescent layer emitting green light, and a luminescent layer emitting blue light.

20. The display apparatus as claimed in claim 17, the color luminescent regions including electroluminescent devices each having a structure in which a luminescent material is sandwiched between a pair of electrodes, and the electroluminescent devices being formed in the form of spiral patterns.

21. The display apparatus as claimed in claim 20, the electroluminescent devices being formed in the form of patterns without crossing each other.

22. The display apparatus as claimed in claim 17, the spiral pattern of each of the color luminescent regions having a pattern form which is substantially concentric and in which the luminescent colors exist periodically.

23. The display apparatus as claimed in claim 22, a form of patterns of luminescent regions of a plurality of colors which is substantially concentric and in which the luminescent colors exist periodically, being used as one unit, and the surface light source for emitting light over a required area including a plurality of the units.

24. The display apparatus as claimed in claim 1, the display apparatus being a direct-view-type display apparatus.

25. A display apparatus, comprising:
a planar optical modulation panel; and
a surface light source arranged on the back of the planar optical modulation panel, having at least a first luminescent region including a luminescent material emitting light with a first color and a second luminescent region including a luminescent material emitting light with a second color different from the first color in a surface substantially parallel to a surface of the planar optical modulation panel, the first luminescent region and the second luminescent region having spiral form;

the surface light source having the first luminescent region and the second luminescent region with a structure in which a plurality of luminescent materials having different luminescent colors are arranged as a periodic alignment of a specific pattern within one plane on a substrate having a transparent first electrode formed thereon, a second electrode being formed on a luminescent layer including each of the luminescent materials and including a voltage source for applying a voltage sufficient to emit light between the selected first and second electrodes in a selected period;

the plurality of organic luminescent layers being formed in the shape of stripes and in a plurality of repetition units of a set of colors, and a pitch p of each of the color stripe sets and a distance d between a light shutter surface of the planar optical modulation panel and the luminescent layers having a relationship expressed by $p/d<1.1$.

26. The display apparatus as claimed in claim 25, the surface light source further comprising a third luminescent region including a luminescent material emitting light with a third color different from the first and second colors.

27. The display apparatus as claimed in claim 25, the first, second, and third luminescent regions being a luminescent layer emitting red light, a luminescent layer emitting green light, and a luminescent layer emitting blue light.

28. The display apparatus as claimed in claim 25, the color luminescent regions including electroluminescent devices each having a structure in which a luminescent material is sandwiched between a pair of electrodes, and the electroluminescent devices being formed in the form of spiral patterns.

29. The display apparatus as claimed in claim 28, the electroluminescent devices being formed in the form of patterns without crossing each other.

30. The display apparatus as claimed in claim 25, the spiral pattern of each of the color luminescent regions having a pattern form which is substantially concentric and in which the luminescent colors exist periodically.

31. The display apparatus as claimed in claim 30, a form of patterns of luminescent regions of a plurality of colors which is substantially concentric and in which the luminescent colors exist periodically, being used as one unit, and the surface light source for emitting light over a required area including a plurality of the units.

32. The display apparatus as claimed in claim 25, the display apparatus being a direct-view-type display apparatus.

* * * * *